United States Patent
Richt et al.

(10) Patent No.: US 8,044,725 B2
(45) Date of Patent: Oct. 25, 2011

(54) SIGNAL GENERATOR WITH DIRECTLY-EXTRACTABLE DDS SIGNAL SOURCE

(75) Inventors: Bernhard Richt, Munich (DE); Joachim Danz, Ottobrunn (DE); Guenther Klage, Zorneding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 342 days.

(21) Appl. No.: 12/090,641

(22) PCT Filed: Oct. 11, 2006

(86) PCT No.: PCT/EP2006/009828
§ 371 (c)(1), (2), (4) Date: Apr. 17, 2008

(87) PCT Pub. No.: WO2007/045388
PCT Pub. Date: Apr. 26, 2007

(65) Prior Publication Data
US 2008/0258833 A1 Oct. 23, 2008

(30) Foreign Application Priority Data
Oct. 17, 2005 (DE) .................. 10 2005 049 578

(51) Int. Cl.
*H03L 7/00* (2006.01)
(52) U.S. Cl. ............ 331/23; 331/17; 327/106; 375/376; 708/271
(58) Field of Classification Search .................. 331/16, 331/17, 23; 327/106, 147, 156; 375/376; 708/271
See application file for complete search history.

(56) References Cited

U.S. PATENT DOCUMENTS

| | | | |
|---|---|---|---|
| 5,028,887 A * | 7/1991 | Gilmore | 331/18 |
| 5,128,623 A | 7/1992 | Gilmore | |
| 5,184,092 A | 2/1993 | Shahriary et al. | |
| 5,408,687 A | 4/1995 | Ooga | |
| 5,742,208 A | 4/1998 | Blazo | |
| 6,154,095 A * | 11/2000 | Shigemori et al. | 331/16 |
| 6,163,223 A * | 12/2000 | Kapetanic et al. | 331/2 |
| 6,778,138 B2 * | 8/2004 | Purdy et al. | 342/377 |
| 6,903,615 B2 * | 6/2005 | Landman et al. | 331/57 |
| 7,199,959 B1 * | 4/2007 | Bryant | 360/51 |
| 2002/0094036 A1 | 7/2002 | Jackson et al. | |
| 2004/0056799 A1 * | 3/2004 | Sinsky et al. | 342/368 |

FOREIGN PATENT DOCUMENTS

| | | | |
|---|---|---|---|
| EP | 0661815 | | 7/1995 |
| JP | 07-123000 | * | 5/1995 |
| JP | 09023158 | | 1/1997 |

OTHER PUBLICATIONS

International Search Report of PCT/EP2006/009828 (English translation included), Form PCT/ISA/210 (second sheet and patent family annex), mailed Dec. 27, 2006.

* cited by examiner

*Primary Examiner* — Levi Gannon
(74) *Attorney, Agent, or Firm* — Ditthavong Mori & Steiner, P.C.

(57) ABSTRACT

A signal generator including a DDS-signal source that is configured to operate according to the principle of direct digital synthesis (DDS), and a PLL signal synthesizer that is configured to operate according to the principle of phase locked loop (PLL) using an output signal from the DDS-signal source as a reference signal. The DDS-signal source can be connected via a direct connection, without further frequency division or mixing, directly to an output of the signal generator or directly to a level-adjustment device of the signal generator in order to generate a portion of an overall frequency range of an output signal of the signal generator.

12 Claims, 3 Drawing Sheets

SIGNAL GENERATOR WITH DIRECTLY-EXTRACTABLE DDS SIGNAL SOURCE

CROSS-REFERENCE TO RELATED APPLICATIONS

The present application claims priority to PCT Application No. PCT/EP2006/009828, filed on Oct. 11, 2006, and to German Patent Application No. DE 10 2005 049 578.8, filed on Oct. 17, 2005, the entire contents of which are herein incorporated by reference.

BACKGROUND OF THE INVENTION

1. Field of the Invention

The present invention relates to a signal generator with a DDS synthesizer instead of a down mixer.

2. Discussion of the Background

Modern signal generators are required for a wide range of applications. In order to be suitable for the maximum possible number of such measuring applications, the signal generator must provide an extremely broad HF frequency range with very high frequency resolution. Currently-available signal generators are therefore specified with a frequency range from a few kHz up to 6 GHz. Special microwave generators even supply HF signals from typically 10 MHz into the high-frequency range up to 60 GHz. However, these are not generally used for the above-named applications because of the relatively higher price.

A distinction can be made between two classes of signal generators. On the one hand, there are digitally-modulated signal generators, which generate complex IQ-modulated HF signals, as used nowadays primarily in mobile telephone systems. On the other hand, there are analog-modulated signal generators, which offer the classical analog-modulation methods such as frequency/phase modulation, amplitude modulation and pulse modulation.

Frequency generation in currently-available signal generators is implemented by means of synthesizers. Two methods are used to generate the required high level of frequency resolution of the synthesizer (within the range of a few µHz or even lower). On the one hand, there is the fractional-N-method, in which a frequency divider in the return path of a phase locked loop (PLL) or in the reference path upstream of the phase detector is varied dynamically with regard to the division factor in such a manner that, averaged over time, fractional division ratios of any required resolution are obtained. The second method is a synthesizer based on the principle of direct digital synthesis (the direct digital synthesis (DDS) principle), wherein the DDS generates either the reference signal of a PLL or can be used in the return path of a PLL as a type of fractional divider.

In this case, the HF signal of the synthesizer is supplied by voltage-controlled oscillators (VCO), which are connected via a PLL as described above to the constant quartz reference of the generator. These generally cover one frequency octave, the so-called basic octave. With subsequent frequency division, multiplication and mixing, the HF output signal of the signal generator is generated within a frequency range of the required magnitude.

VCOs generally supply HF signals within a frequency range from, for example, 750 MHz to 1500 MHz. The frequency range 1500 MHz to 3000 MHz, in this example, is obtained through simple frequency doubling. The range from 3000 MHz to 6000 MHz is obtained by further doubling. The frequency range 375 MHz to 750 MHz is obtained by frequency division by 2, and the range 187.5 MHz to 375 MHz is obtained by division by 4, and so on.

Digital frequency dividers have the disadvantage that they provide square-wave signals at their output, which must subsequently be subjected to complex low-pass filtering, in order to obtain a sinusoidal HF output signal with a low harmonic. When using non-adjustable low-pass filters, at least two filters of this kind are required for each octave.

An extremely high expenditure on division and filtering would be required, if it were necessary to generate a sinusoidal HF output signal by means of frequency division up to the kHz range, which would incur large costs determined by the need for a frequency divider and filter at every stage.

Hitherto, it has therefore been conventional to generate the lower frequency range with a down mixer. This requires a relatively higher-frequency oscillator signal, which is derived from the quartz reference of the signal generator. The derivation is implemented via a phase locked loop. With this known method, signal frequencies are generated on the basis of an oscillator frequency using a variable frequency divider and a phase difference formation within a closed loop arrangement.

Typical configurations for generating the lower frequency range are based upon a frequency of the basic octave. In this context, a fractional divider is generally used:

LO signal: 1000 MHz

Down mixer range: 9 kHz to 100 MHz

HF signal of the down mixer: 1000.009 to 1100 MHz (contained in the basic octave of the synthesizer).

SUMMARY OF THE INVENTION

The present invention advantageously provides a signal generator with a synthesizer concept, which no longer requires the down mixer to generate the lower frequency range and which therefore leads to a significant reduction in costs.

According to an aspect of the invention, a portion of the overall frequency range is generated by connecting an output signal of a DDS signal source, without further frequency division or frequency mixing, directly to a level-adjustment device or an output of the signal generator via a direct connection. It is therefore possible to avoid a down mixer, with high-frequency oscillator signal as required, thereby reducing the complexity of the circuit for the signal generator.

Further advantageous developments are provided by the invention, as discussed below.

Reducing the complexity of the circuit for the signal generator also reduces the space requirement for the circuit as a whole. The hardware requires less space, and the signal generator can therefore be manufactured in a more compact manner as a whole. The reduced expenditure on components associated with the complexity of the circuit also reduces manufacturing costs and the likelihood of failure of the device.

The output spectrum of the DDS signal source (also referred to as a DDS synthesizer) is derived directly from the quartz reference and therefore offers very good phase-noise values. According to the invention, this output spectrum, which cannot be realized with the previously-conventional down mixer concept, can be connected directly to the level-adjustment device or to the output.

Current DDS technology allows additional functions such as the programming of the DDS core. Within this context, a very high-quality of analog modulation can be achieved by digital implementation. In particular, with a direct connection of the signal from the DDS source to the output, the very good phase-noise properties can be transferred to the output signal.

One further advantage of the invention is the reduced power consumption of the circuit as a whole. The power consumption can be reduced by dispensing with the mixer-amplifier of the local oscillator and the generation of a mixer-frequency, thereby reducing the design specifications for the power-supply components and supply lines.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1:
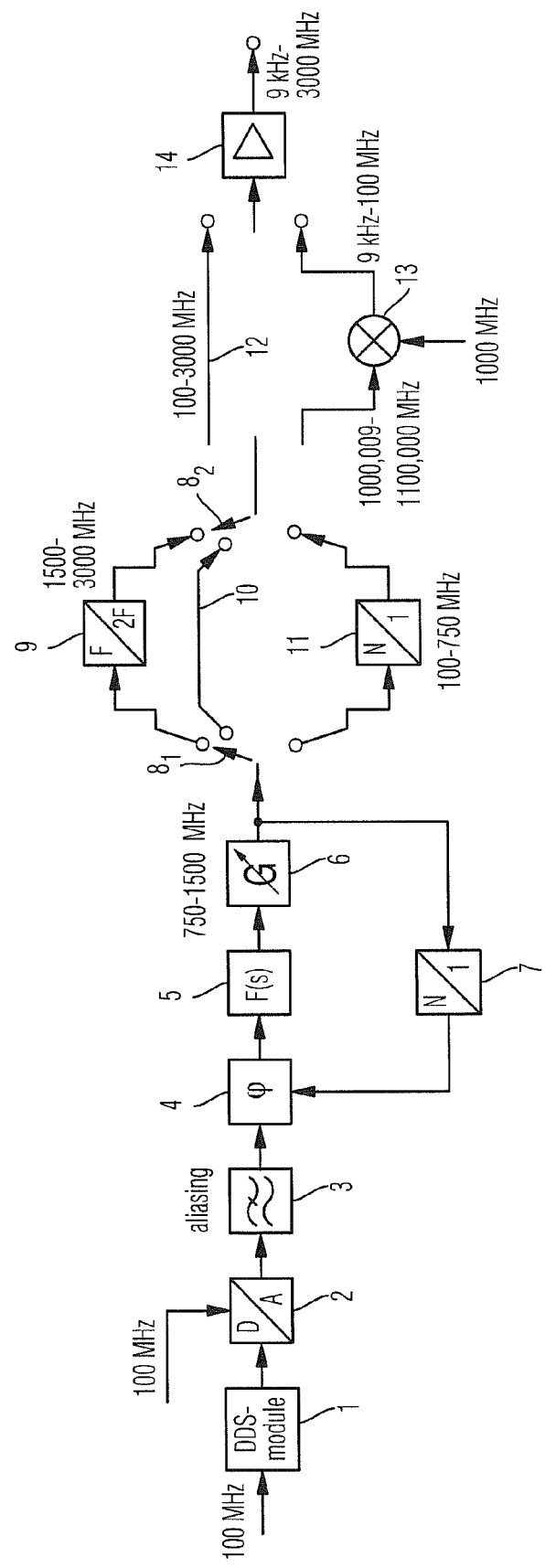
FIG. 1 shows a related art synthesizer concept.

Embodiments of the present invention will be described hereinafter with reference to the accompanying drawings. In the following description, the constituent elements having substantially the same function and arrangement are denoted by the same reference numerals, and repetitive descriptions will be made only when necessary.

FIG. 1 illustrates a related art synthesizer concept. This synthesizer design consists of a DDS module 1, a digital/analog converter 2, an aliasing filter 3, a PLL with a phase detector 4, a filter 5, a voltage-controlled oscillator 6 and a variable divider 7.

FIG. 1 shows one configuration of the synthesizer of the related art. A signal frequency of 100 MHz is used as a clock-pulse signal. This controls the DDS module 1 and the digital/analog converter 2. An analog signal with a maximum frequency of 50 MHz is therefore connected to the input of the aliasing filter 3. The aliasing filter 3 is used to reduce intermodulations, noise and harmonic multiples, which arise as a result of glitches at the output of the digital/analog converter 2.

A clock-pulse signal is supplied to the DDS module 1. The clock-pulse signal in this context has a frequency, for example, of 100 MHz. The output signal of the DDS module is stored in the digital/analog converter 2. Another clock-pulse signal is supplied to a second input of the digital/analog converter 2, of which the frequency in is also 100 MHz. The output signal of the digital/analog converter 2 forms the input signal for the filter 3. The filter 3 is an aliasing filter used for the removal of undesired upper harmonics or harmonics of the clock frequency. The output signal of the filter 3, either filtered or with the harmonics of the basic frequency removed, is finally connected to one of the inputs of the phase detector 4.

The phase detector 4, the filter 5, a voltage-controlled oscillator 6 and a variable divider 7 are disposed in the forward loop of the phase-locked loop. The output signal of the phase detector 4 is initially supplied to the filter 5. This forms the integrator in the phase locked loop. This output voltage of the filter 5 forms the input signal of the voltage-controlled oscillator 6 in the form of a step function. Dependent upon the default voltage, the output frequency of the voltage-controlled oscillator 6 is therefore adapted to the requirements of the default frequency.

On the one hand, the output signal of the voltage-controlled oscillator 6 forms the output signal of the phase locked loop and, on the other hand, the comparison signal for the default setting in the return path of the closed loop. The frequency divider 7 divides the frequency of the input signal and supplies this to the phase detector 4.

Within the locked loop, the output signal of the frequency divider 7 is supplied to the phase detector 4. The phase detector 4 generates a comparison signal on the basis of a phase comparison of the output signal from the frequency divider 7 and the filtered signal from the filter 3.

In the block circuit diagram presented in FIG. 1, the PLL is followed by an arrangement either for doubling the output signal, for dividing the output signal or connecting the output signal directly to subsequent stages.

The output signal of the voltage-controlled oscillator 6 can be supplied via a selector switch $8_1$ to the frequency doubler 9, via a direct connector 10 to the selector switch $8_2$ or to the variable frequency divider 11. The signal leading away from the selector switch $8_2$ can be supplied via a direct connector 12 or via the mixer 13 to the level adjustment device 14.

At its output, the illustrated PLL circuit provides signals with a frequency from 750 MHz to 1500 MHz. As mentioned above, the frequency of these signals can be either further increased or respectively further reduced. Frequency doubling or division is implemented in the given configuration so that signals within the range from 100 MHz to 3000 MHz can be generated.

Moreover, signals of the frequencies 1000.009 to 1100.000 MHz can be generated by the down mixer. The input signal is reduced by a frequency of 1000 MHz and accordingly mixed into the frequency range from 9 kHz to 100 MHz, thereby extending the overall frequency range from a range of 100 MHz to 3000 MHz to a range of 9 kHz to 3000 MHz.

The signal supplied to the mixer 13 (the signal includes frequencies between 1000.009 MHz and 1100.000 MHz) is mixed with a signal, which is supplied to the mixer at a second input. The mixer 13 represents a down mixer, with which an input signal can be mixed down. The input signal in the circuit can originate either from the frequency doubler 9, the frequency divider 11 or directly from the phase locked loop (PLL). In the block circuit diagram presented in FIG. 1, the frequency of the reference signal or mixed signal supplied is 1000.000 MHz. Accordingly frequencies between 9 kHz and 100 MHz are available at the output of the mixer 13.

The output signal of the level-adjustment device 14 is the output signal of the signal generator. In the block circuit diagram presented in FIG. 1, the output signal therefore includes frequencies within the frequency range between 9 kHz and 3000 MHz. The level-adjustment device is an amplifier adjustable with regard to the amplification factor or an attenuation element adjustable with regard to the attenuation factor.

Figure 2:
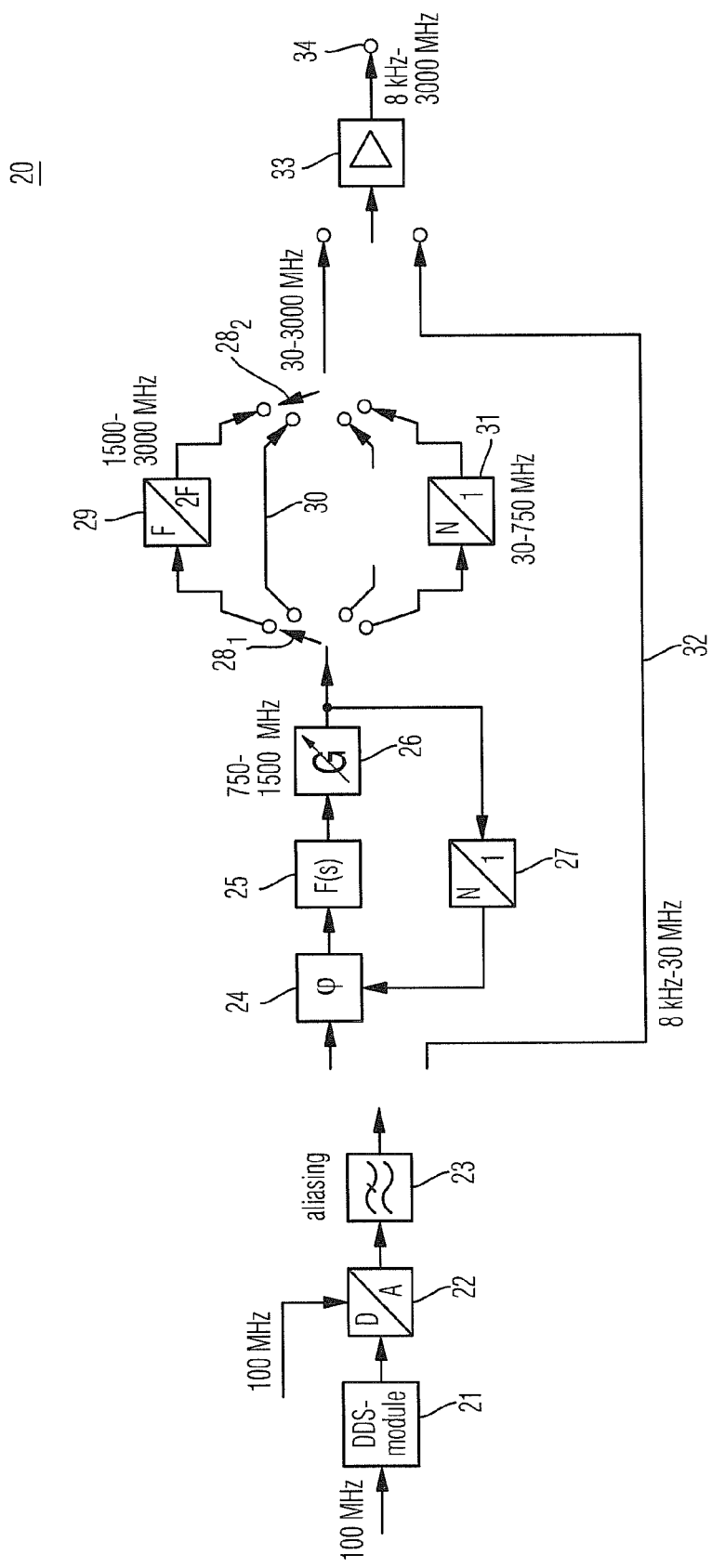
FIG. 2 shows a synthesizer concept according to an embodiment of the present invention.

FIG. 2 illustrates a modified synthesizer concept 20 according to the present invention.

The synthesizer in FIG. 2 includes a DDS module 21, a digital/analog converter 22, an aliasing filter 23, a PLL with phase detector 24, a filter 25, a voltage-controlled oscillator 26 and a frequency divider 27, a frequency doubler 28, a variable frequency divider 29, a through connection 30 and a level-adjustment device 33.

A clock-pulse signal is supplied to the DDS module 21, wherein the clock-pulse signal in this example also has a frequency of 100 MHz. The output signal of the DDS module is supplied to a digital/analog converter 22. Another clock-pulse signal, of which the frequency in the example is also 100 MHz, is supplied to a second input of the digital/analog converter 22. The output signal of the digital/analog converter 22 forms the input signal for the filter 23. The filter 23 here is also an aliasing filter. The output signal of the filter 23, either filtered or with the harmonic of the basic frequency removed, is finally supplied to one of the inputs of the phase detector 24.

In the embodiment according to the invention, the frequency configuration of the synthesizer is approximately the same as indicated in FIG. 1. A frequency of 100 MHz is used as the clock-pulse signal in the example. This controls the DDS module 21 and the digital/analog converter 22. Accordingly, the aliasing filter 23 receives an analog signal with a maximum frequency of 50 MHz at the input.

In a similar manner to the circuit shown in FIG. 1, the three components: DDS module 21, digital/analog converter 22, and aliasing filter 23 supply the default signal for the phase locked loop 24, 25, 26, 27 but also, at the same time, according to the invention, the direct signal for the lower frequency range of the signal generator 20.

In this case, a phase detector 24, the filter 25, a voltage-controlled oscillator 26 and a variable divider 27 are also disposed in the forward loop of the phase locked loop. Initially, the output signal of the phase detector 24 is supplied to the filter 25. This forms the integrator in the phase locked loop. Its output voltage provides the input signal of the voltage-controlled oscillator 26 in the form of a step function. Dependent upon the default voltage, the output frequency of the voltage-controlled oscillator 26 is therefore adapted to the default frequency.

The phase locked loop 24, 25, 26, 27 includes the phase detector 24, the filter 25, the voltage-controlled oscillator 26 and the variable frequency divider 27.

The variable frequency divider 27, by means of which the output-signal frequency of the phase locked loop is determined, is disposed in the return pathway of the locked loop. Its output signal is supplied to the second input of the phase detector 24 and compared with the default from the aliasing filter 23.

Here also, following the phase locked loop, there is preferably an arrangement for doubling, dividing or connecting the output signal directly to the subsequent units. With regard to the function of the elements $28_1$, $28_2$, 29, 30, 31 and 33, reference can be made to FIG. 1, wherein these elements correspond to the elements 9, 10, 11 and 14 of the same kind.

As in the related art, the illustrated PLL circuit of FIG. 2 of the present invention provides signals with a frequency from 750 MHz to 1500 MHz at the output. The frequency of the signals can be either increased or reduced. In the given configuration, a frequency doubling or frequency division is implemented, so that signals can be generated within the range from 30 MHz to 3000 MHz.

By contrast with the circuit in FIG. 1, the output signal of the DDS module in this circuit according to the invention can be connected, after digital/analog conversion with the digital/analog converter 22 and filtering with the filter 23, directly to the output via the connection 32.

The circuit provides signals within the frequency range from 8 kHz to 3000 MHz. The lower frequency range from 8 kHz to 30 MHz is supplied directly from the output of the aliasing filter 23 to the output of the signal generator 20 via the direct connection 32. The frequency range from 30 to 3000 MHz is generated by the PLL, by frequency division and frequency doubling.

The down mixer 13 is no longer required because the lower frequency range in the embodiment according to the invention is transferred by a direct connection 32 to a level-adjustment device 33.

The complex down mixing associated with high costs is therefore avoided. Signals with frequencies 1000.009 MHz to 1030.000 MHz do not need to be generated first and then mixed down. With the embodiment according to the invention, the input signal of a relatively-high frequency with a fractional component need not be reduced by a frequency of 1000 MHz and therefore mixed into the lower frequency range from 8 kHz to 30 MHz. Accordingly, the overall frequency range is expanded from a range of 30 MHz to 3000 MHz to a range of 8 kHz to 3000 MHz without the need for the use of a down mixer.

According to the related art, the down mixing signal, for example, 1000 MHz, as in FIG. 1, must be provided and supplied to the down mixer. If it cannot be derived directly from the clock-pulse frequency, the generation of the down mixing signal is associated with the provision with another phase locked loop.

The output signal of the level-adjustment device 33 is the output signal of the signal generator 20. In the exemplary embodiment, the output signal comprises frequencies within the frequency range between 8 kHz and 3000 MHz.

Figure 3:
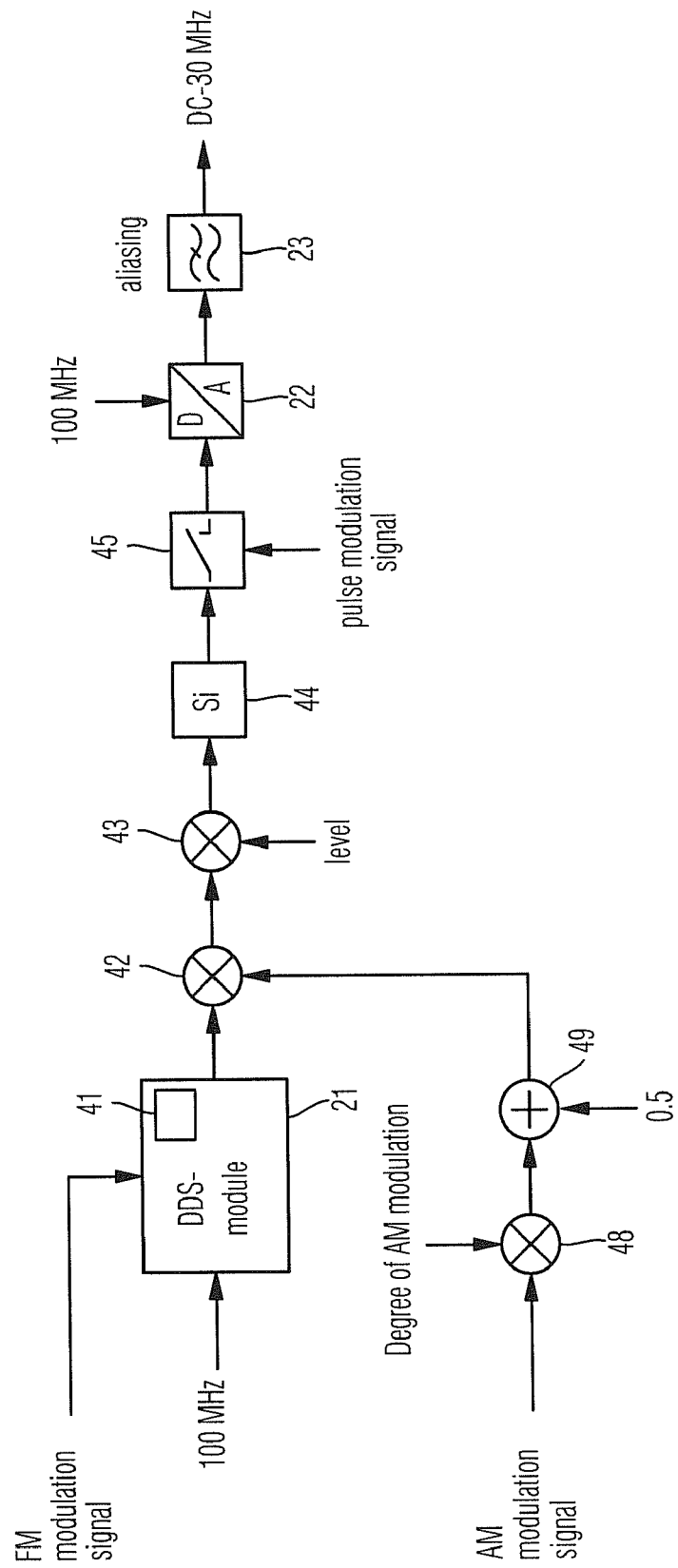
FIG. 3 shows a detailed block circuit diagram of the DDS core with AM, FM, level adjuster and a Si-preemphasis unit according to an embodiment of the present invention.

A modified block circuit diagram for the provision of modulated signals is shown in FIG. 3 as a second exemplary embodiment of the present invention. A DDS module 21 generates digital, frequency-modulated or phase-modulated signals. The default setting is implemented through a separate input, which represents the time-dependent alteration of the modulation word. The digital FM signal, which is provided at the output of the DDS module, can additionally be amplitude modulated. An AM modulation signal input, the default setting of a degree of AM modulation and the provision of an additional offset value of 0.5 are used for this purpose.

The level of the AM/FM signal can still be modified, frequency-corrected in a Si-preemphasis unit, and pulse modulated. Before the analog signal is provided at the output, the digital signal is converted via a digital/analog converter 22 into an analog signal and supplied to an aliasing filter 23.

In the configuration presented, the DDS module 21 is operated with a clock-pulse or basic frequency of 100 MHz. FM signals or PM signals up to a frequency of 30 MHz are provided at the output.

An FM modulation signal can control the DDS module 21 directly. This is again supplied with the clock-pulse signal at the second input. In the exemplary embodiment, a clock-pulse frequency of 100 MHz is also provided. This DDS signal source has at its disposal one or more so-called phase registers or frequency registers $41_1$, into which the modulation word is written. The output signal of the DDS signal source 41 is supplied to mixer 42.

The AM modulation signal is supplied to a mixer 48. The degree of AM modulation is supplied to the same mixer 48. The output signal of the mixer 48 is supplied to an adder 49. A constant value, for example, 0.5 is also supplied to the adder 49. The output signal of the adder 49 is supplied to the mixer 42.

The combined signal from the mixer 42 is supplied to the mixer 43. Moreover, a level is supplied to the mixer 43, and accordingly the signal is provided with a level. The output signal of the mixer 43 is supplied to a Si-preemphasis unit 44 and frequency-response corrected. The signal can also be pulse-modulated in a pulse-modulation unit 45. For this purpose, a pulse-modulation signal is supplied to a second input of the pulse-modulation unit 45. The output signal of the pulse-modulation unit 45 is supplied to the digital/analog converter 22.

The invention is not restricted to the exemplary embodiments described. The signal generator according to the invention can be used in a versatile manner. All of the elements described and illustrated may be combined with one another as required.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

The invention claimed is:

1. A signal generator comprising:
   a DDS-signal source that is configured to operate according to the principle of direct digital synthesis (DDS), wherein the DDS-signal source comprises a DDS module, and a multiplier configured to generate a pulse modulation by multiplying a digital output word of the DDS module by a digital modulation word; and
   a PLL signal synthesizer that is configured to operate according to the principle of phase locked loop (PLL) using an output signal from the DDS-signal source as a reference signal,
   wherein the signal generator is configured to generate signals of a wide range of frequencies from a few kHz up to microwave frequencies,
   wherein the output signal from the DDS-signal source is of a frequency range comprising a portion of an overall frequency range of the signal generator, and
   wherein, if a desired output frequency of the signal generator is within the frequency range of the output signal from the DDS-signal source, the signal generator is configured to output the output signal from the DDS-signal source as an output of the signal generator, without further frequency division or mixing, irrespective of the state of the PLL signal synthesizer.

2. The signal generator according to claim 1, wherein the frequency range of the output signal from the DDS-signal source comprises a lower portion of the overall frequency range of the signal generator.

3. The signal generator according to claim 2, further comprising a frequency doubler and/or frequency divider connected downstream of the PLL signal synthesizer.

4. The signal generator according to claim 2, wherein the DDS-signal source includes digital level adjusters configured to fine tune an amplitude of the output signal of the signal generator.

5. The signal generator according to claim 2,
   wherein the DDS-signal source includes a frequency register and/or a phase register, and
   wherein a frequency modulation or a phase modulation is implemented by an addition of a modulation word respectively to the frequency register and/or the phase register of the DDS signal source.

6. The signal generator according to claim 1, further comprising a frequency doubler and/or frequency divider connected downstream of the PLL signal synthesizer.

7. The signal generator according to claim 1, wherein the DDS-signal source includes digital level adjusters configured to fine tune an amplitude of the output signal of the signal generator.

8. The signal generator according to claim 1,
   wherein the DDS-signal source includes a frequency register and/or a phase register, and
   wherein a frequency modulation or a phase modulation is implemented by an addition of a modulation word respectively to the frequency register and/or the phase register of the DDS signal source.

9. A signal generator comprising:
   a DDS-signal source that is configured to operate according to the principle of direct digital synthesis (DDS), wherein the DDS-signal source comprises a DDS module, and a multiplier configured to generate a pulse modulation by multiplying a digital output word of the DDS module by a digital modulation word; and
   a PLL signal synthesizer that is configured to operate according to the principle of phase locked loop (PLL) using an output signal from the DDS-signal source as a reference signal,
   wherein the signal generator is configured to generate signals of a wide range of frequencies from a few kHz up to microwave frequencies,
   wherein the output signal from the DDS-signal source is of a frequency range comprising a lower portion of an overall frequency range of the signal generator in a range of approximately 8 kHz to approximately 30 MHz, and
   wherein, if a desired output frequency of the signal generator is within the frequency range of the output signal from the DDS-signal source, the signal generator is configured to output the output signal from the DDS-signal source as an output of the signal generator, without further frequency division or mixing, irrespective of the state of the PLL signal synthesizer.

10. The signal generator according to claim 9, further comprising a frequency doubler and/or frequency divider connected downstream of the PLL signal synthesizer.

11. The signal generator according to claim 9, wherein the DDS-signal source includes digital level adjusters configured to fine tune an amplitude of the output signal of the signal generator.

12. The signal generator according to claim 9,
    wherein the DDS-signal source includes a frequency register and/or a phase register, and
    wherein a frequency modulation or a phase modulation is implemented by an addition of a modulation word respectively to the frequency register and/or the phase register of the DDS signal source.

* * * * *